United States Patent [19]

Kuzel et al.

[11] Patent Number: 4,521,250
[45] Date of Patent: Jun. 4, 1985

[54] MIXTURE FOR PREPARATION OF PROTECTIVE AND INSULATING COATINGS ON METALS

[75] Inventors: Radomir Kuzel, Prague; Josef Broukal, Hradec Kralove; Vaclav Bouse, Pribram, all of Czechoslovakia

[73] Assignee: Universita Karlova, Prague, Czechoslovakia

[21] Appl. No.: 608,980

[22] Filed: May 10, 1984

[30] Foreign Application Priority Data

May 10, 1983 [CS] Czechoslovakia ............ 3290-83

[51] Int. Cl.³ .................................. C09D 5/14
[52] U.S. Cl. ........................ 106/15.05; 106/18.12; 106/18.13; 106/175; 106/193 R; 252/62; 501/15; 501/17; 501/20; 501/25; 501/30; 501/44; 501/77
[58] Field of Search ............. 106/15.05, 18.12, 18.13, 106/174, 193 R, 175; 252/518, 62; 501/15, 17, 20, 25, 30, 44, 77

[56] References Cited

U.S. PATENT DOCUMENTS 2,886,476  5/1959  Dumesnil et al. .............. 501/17
3,764,354  10/1973  Ritze et al. .................... 501/77

Primary Examiner—Lorenzo B. Hayes

[57] ABSTRACT

A mixture for preparation of protective and insulating coatings on metals and metal products which sticks well to metal surfaces, is resistant to high temperatures, has good electrical properties, and provides good heat removal. The mixture includes aluminum oxide, barium oxide, boron oxide, silicon oxide, and aluminum fluoride.

9 Claims, No Drawings

MIXTURE FOR PREPARATION OF PROTECTIVE AND INSULATING COATINGS ON METALS

BACKGROUND OF THE INVENTION

This invention relates to a mixture for preparation of protective and insulating coatings on metals and on metal products. Such mixtures are applied in the form of powder or paste and are resistant to high temperature and have good electrical properties. The present invention relates particularly to the application of insulating materials on metal bearing plates covered by insulating material in hybrid electronics.

Protective and insulating coatings are applied on metals in different ways, for example by application of different varnishes or suitable enamels and the like. Enamels applied on steel sheets are resistant to higher temperatures and are therefore used for preparation of bearing plates in hybrid electronics for printed circuits and for resistors, which can be subsequently burnt at maximum temperatures of 675° C. Actual electronic circuits, however, require not only burning of insulating metal bearing plates at high temperatures but also require effective heat removal from power loaded electronic parts. A good electrical insulation of active electronic elements from metal parts together with good heat removal is also frequently required. These requirements can be met by application of beryllium ceramics either as bearing plates for electronic hybrid circuits or as insulating means between an active power loaded element and a metal part securing heat removal. A drawback of beryllium ceramics is its high cost and the occupational health hazard due to its high toxicity.

SUMMARY OF THE INVENTION

It is an object of this invention to provide a mixture for a protective and insulating coating which would adhere to different metal and metal products, which has good electrical properties, would be resistant to high temperatures, and is capable of effective heat removal. The mixture according to this invention comprises residual amounts of up to 96% by weight of aluminum oxide, 1 to 70% by weight of barium oxide, 1 to 70% of boron oxide, residual amounts to 30% by weight of silicon oxide and residual amounts to 40% by weight of aluminum fluoride. According to a further alternative, it can comprise 0.05 to 6% by weight of colbalt oxide, 0.05 to 12% by weight of zinc oxide and 0.05 to 10% by weight of manganese dioxide.

A substantial advantage of this mixture for preparation of coatings is that it can be prepared for different metals, particularly for copper, steel, molybdenum, tungsten, kovar and the like, whereby it attains, according to the composition, a glass like or nearly ceramic character and can be exposed to temperatures of 650° to 1000° C. In some cases it can even be exposed to higher temperatures so that copper or steel sheets coated by this coating can be applied as bearing plates for hybrid circuits with high temperature heat treatment or as plates for mounting of electronic elements which require good insulating properties while securing intensive heat removal.

The additionally mentioned oxides are used in cases where a greater adhesive ability, different deformation temperatures or dielectric properties are required.

In order to increase the adhesive ability of the burnt coating on metal it is advisable to apply on the metal surface a nickel layer and burn it at temperatures of 700° to 1000° C. for 1 to 60 minutes or use an intermediate layer of another kind according to the metal used.

The coating can be applied by means of a mixture comprising up to 96 weight parts of aluminum oxide, 4 to 100 weight parts of finely ground glass frit and an evaporable liquid. The glass frit is composed of 10 to 70% by weight of barium oxide, 10 to 70% by weight of boron oxide, residual amounts up to 30% by weight of magnesium oxide, residual amounts up to 40% by weight of aluminum fluoride, and possibly a residual amount up to 6% by weight of cobalt oxide and/or a residual amount up to 12% by weight of zinc oxide and/or a residual amount up to 10% by weight of manganese oxide.

It is also possible to apply a coating from the mentioned dry mixture of aluminum oxide and finely ground glass frit after hydrophobization has been accomplished by the method of spraying within a strong electrostatic field. The powder for application of the coating on metal by this method can be equally prepared by sintering the dry mixture of aluminum oxide and glass frit at temperatures of 800° to 1100° C. for 30 to 120 minutes, by subsequent grinding in a ball mill to particles smaller then 60 $\mu$m and by hydrophobization.

EXAMPLES

Mixtures according to this invention will be described in more detail in the following exemplary embodiments.

EXAMPLE 1

Glass frit composed of 50% by weight of barium oxide, 40% by weight of boron oxide, 5% by weight of silicon oxide and 5% by weight of aluminum fluoride are crushed and ground to particles smaller than 10 $\mu$m. Thereafter a paste is prepared from a composition of 72 weight parts of aluminum oxide, 28 weight parts of ground glass frit and 40 weight parts of an evaporable liquid containing 10% by weight of ethylcellulose and 90% by weight of terpineol. A copper sheet is provided with a nickel coating of a thickness of 5 to 25 $\mu$m either electrolytically or chemically and is burnt at a temperature of 900° C. for 10 minutes. By the net printing method a coating is supplied from the prepared paste on the prepared surface which, after drying at a temperature of 150° C. for 5 to 10 minutes, is burnt at a temperature of 860° C. for a time of 5 minutes. The created coating is of white-gray color, sticks well on the copper sheet even at high temperatures and does not peel off even in case of a sudden cooling from 700° C. into water.

EXAMPLE 2

A copper sheet covered by a thin layer of copper oxide which is obtained by burning at a temperature of 700° C. for 2 minutes is coated as in Example 1. The created coating sticks equally well on the copper. At a repeated following heating of the sheet at a temperature of 800° C. the copper oxide, contrary to Example 1, can diffuse to the surface of the coating.

EXAMPLE 3

A coating as in Example 1 is applied on all sides of a molibdenum sheet and is burnt at a temperature of 820° C. for 1 to 2 minutes. The created coating sticks on the molibdenum very well and forms a good insulating layer.

EXAMPLE 4

A coating is prepared on a copper sheet as in Example 1 with the sole difference that the glass frit is composed of 38.5% by weight barium oxide, 48.5% by weight boron oxide, 4.85% by weight silicon dioxide, 4.85% by weight aluminum fluoride and 3% by weight cobalt oxide. The created layer is light violet color and sticks very well on the copper sheet.

EXAMPLE 5

A coating is prepared on a copper sheet as in Example 1 with the difference being that there is used a paste composed of 40 weight parts of aluminum oxide, 60 weight parts of finely ground glass frit of a composition as in Example 1 and 40 weight parts of an evaporable liquid. The created coating has a glossy enamel character and sticks very well on the copper sheet.

EXAMPLE 6

A coating is prepared on a copper sheet as in example 1 with the difference being that the paste is composed of 100 weight parts of glass frit of a composition as in Example 1 with 40 weight parts of an evaporable liquid. The created coating is transparent with a glass like surface.

EXAMPLE 7

A mixture composed of 70 weight parts of aluminum oxide and 30 weight parts of glass frit of a composition as in Example 1 is sintered at a temperature of 900° C. for 50 minutes and ground in a ball mill to particles smaller than 60 μm and hydrophobized by addition of 0.1 weight part of silicon. The prepared powder is applied on a steel sheet provided with a layer of nickel burnt at a temperature of 940° C. for 15 minutes within a strong electrostatic field at a potential difference of 60 kV. The applied coating is burnt at a temperature of 860° C. for 5 minutes. The created coating covers the steel sheet on all sides, including the edges, and sticks to it very well.

EXAMPLE 8

On copper bearing plates provided with a coating according to Example 1, resistors are applied using net printing with resistor pastes used for making resistors on carborundum bearing plates with following burning at a temperature of 820° C. to 875° C. The resistances of resistors were similar to those on carborundum plates, only the resistance coefficient had higher positive values.

Although the invention is described with reference to a plurality of embodiments thereof, it is to be expressly understood that it is in no way limited to the disclosure of such preferred embodiments but is capable of numerous modifications within the scope of the appended claims.

We claim:

1. A mixture for preparation of protective and insulating coatings on metals and on metal products applied in the form of powder and pastes, said mixture consisting essentially of a residual amount up to 96% by weight of aluminum oxide, 1 to 70% by weight of barium oxide, 1 to 70% by weight of boron oxide, residual amounts to 30% by weight of silicon oxide and residual amounts up to 40% by weight of aluminum fluoride.

2. A mixture as in claim 1, further consisting essentially of at least one of the following oxides:
   0.05 to 6% by weight of cobalt oxide
   0.05 to 12% by weight of zinc oxide
   0.05 to 10% by weight of managanese oxide.

3. A mixture for preparation of protective and insulating coatings on metals and on metal products applied in the form of powder and paste, said mixture consisting essentially of:
   72 weight parts of aluminum oxide,
   40 weight parts of an evaporable liquid, said evaporable liquid containing 10% by weight of ethyl cellulose and 90% by weight of terpineol, and
   28 weight parts of a second mixture consisting essentially of:
   50% by weight of barium oxide, 40% by weight of boron oxide, 5% by weight of silicon oxide and 5% by weight of aluminum fluoride.

4. A mixture as claimed in claim 3, wherein components of said second mixture are crushed and ground to particles smaller than 10 μm.

5. A mixture for preparation of protective and insulating coatings on metals and on metal products applied in the form of powder and paste, said mixture consisting essentially of:
   72 weight parts of aluminum oxide,
   40 weight parts of an evaporable liquid, said evaporable liquid containing 10% by weight of ethyl cellulose and 90% by weight of terpineol and
   28 weight parts of a second mixture consisting essentially of:
   38.5% by weight of barium oxide, 48.5% by weight boron oxide, 4.85% by weight silicon dioxide, 4.85% by weight aluminum fluoride and 3% by weight cobalt oxide.

6. A mixture for preparation of protective and insulating coatings on metals and on metal products applied in the form of powder and paste, said mixture consisting essentially of:
   40 weight parts of aluminum oxide,
   40 weight parts of an evaporable liquid, said evaporable liquid containing 10% by weight of ethyl cellulose and 90% by weight of terpineol and
   60 weight parts of a second mixture consisting essentially of:
   50% weight of barium oxide, 40% by weight of boron oxide, 5% by weight of silicon oxide and 5% by weight of aluminum fluoride.

7. A mixture for preparation of protective and insulating coatings on metals and on metal products applied in the form of powder and paste, said mixture consisting essentially of:
   40 weight parts of an evaporable liquid, said evaporable liquid containing 10% by weight of ethyl cellulose and 90% by weight of terpineol and
   100 weight parts of a second mixture consisting essentially of:
   50% by weight of barium oxide, 40% by weight of boron oxide, 5% by weight of silicon oxide and 5% by weight of aluminum fluoride.

8. A mixture for preparation of protective and insulating coatings on metals and on metal products applied in the form of powder and paste, said mixture consisting essentially of:
   70 weight parts of aluminum oxide, and
   30 weight parts of a second mixture consisting essentially of:
   50% by weight of barium oxide, 40% by weight of boron oxide, 5% by weight of silicon oxide and 5% by weight of aluminum fluoride.

9. A mixture as claimed in claim 8, wherein said components of said second mixture are ground to particles smaller than 60 μm and hydrophobized by addition of 0.1 weight parts of silicon.

* * * * *